(12) United States Patent
Voelkel

(10) Patent No.: US 6,253,280 B1
(45) Date of Patent: Jun. 26, 2001

(54) PROGRAMMABLE MULTIPLE WORD WIDTH CAM ARCHITECTURE

(75) Inventor: Eric H. Voelkel, Ben Lomond, CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/273,422

(22) Filed: Mar. 19, 1999

(51) Int. Cl.[7] ................................................... G06F 12/00
(52) U.S. Cl. ................................................ 711/108; 365/49
(58) Field of Search ................................. 711/108; 365/49

(56) References Cited

U.S. PATENT DOCUMENTS

| | | |
|---|---|---|
| 4,996,666 | 2/1991 | Duluk et al. . |
| 5,010,516 | 4/1991 | Oates . |
| 5,072,422 | 12/1991 | Rachels . |
| 5,440,715 | 8/1995 | Wyland . |
| 5,517,441 | 5/1996 | Dietz et al. . |
| 5,592,407 | 1/1997 | Konishi et al. . |

*Primary Examiner*—Do Hyun Yoo
*Assistant Examiner*—Nasser Moazzami
(74) *Attorney, Agent, or Firm*—Bradley T. Sako

(57) ABSTRACT

A content addressable memory (CAM) that is capable of providing multiple word matching is disclosed. According to one embodiment, a CAM (200) includes a word array (206) of data word registers (208-0 to 208-ni). Each data word register (208-0 to 208-ni) provides a word match value (MATCH0-MATCHni) that indicates if an applied comparand value is the same as a data word stored within a data word register (208-0 to 208-ni). Word match values (MATCH0-MATCHni) are received by a match detect circuit (202) that provides a number of encoding values (ENC0-ENCni). In a single word match mode, a comparand value is applied and the encoding values (ENC0-ENCni) can represent single word match values. In a multiple word match mode, a sequence of comparand values are applied and the resulting word match values stored. The resulting encoding values (ENC0-ENCni) can represent the logical combination of multiple word match values.

18 Claims, 6 Drawing Sheets

| LOCATION | DATA |
|---|---|
| 0 | WORD00 |
| 1 | WORD01 |
| 2 | WORD02 |
| 3 | WORD03 |
| 4 | WORD04 |
| 5 | WORD05 |
| 6 | WORD06 |
| 7 | WORD07 |
| 8 | WORD08 |
| 9 | WORD09 |

| LOCATION | DATA |
|---|---|
| 0 | WORD00 |
| 1 | WORD01 |
| 2 | WORD10 |
| 3 | WORD11 |
| 4 | WORD20 |
| 5 | WORD21 |
| 6 | WORD30 |
| 7 | WORD31 |
| 8 | WORD40 |
| 9 | WORD41 |

| LOCATION | DATA |
|---|---|
| 0 | WORD00 |
| 1 | WORD01 |
| 2 | WORD02 |
| 3 | WORD03 |
| 4 | WORD10 |
| 5 | WORD11 |
| 6 | WORD12 |
| 7 | WORD13 |
| 8 | WORD20 |
| 9 | WORD21 |

PROGRAMMABLE MULTIPLE WORD WIDTH CAM ARCHITECTURE

TECHNICAL FIELD

The present invention relates generally to content addressable memories (CAMs) and more particularly to a CAM architecture that can provide multiple word matching capabilities.

BACKGROUND OF THE INVENTION

Content addressable memories (sometimes referred to as CAMs or associative memories) typically store a number of data word values. The data word values are compared with an applied input value (a comparand) to determine if the comparand matches any of the data word values. If a match occurs, a match indication is generated. The match indication can be used to index an output data value. Thus, each data word values typically indexes to an output data value.

CAMs can be used in a numerous applications. One particular application is that of data packet header processing. Data packets are typically used to transmit data over data network systems. A data packet will typically include an initial "header" portion and a subsequent data portion. A header will include various fields that include the information necessary for processing a data packet. As just one example, if a data packet is transmitted according to the "Internet Protocol" (IP), its header can include a source address, a source port, a destination address, and a destination port. Data packets within an IP network are transmitted from a source location to a destination location by way of a number of network nodes. A transmission of data from one node to the next is often referred to as a "hop."

More straightforward IP packet processing applications involve simply "forwarding" a data packet according to a destination address. An IP network node will include hardware that "looks-up" the destination address within a packet to determine a "next hop" value. Such a look-up operation can be performed by a CAM. The CAM will store a number of destination addresses as data word values. Each data word value will index to a next hop value. An incoming destination address will be then be used as a comparand value for the CAM. Thus, if an incoming destination address matches a stored destination address, a next hop value will be output. This next hop value can then be used to forward the data packet to a next hop location.

While a conventional CAM can be appropriate for a straightforward destination address look-up, a conventional CAM is not suitable for more complex network functions. For example, the conventional forwarding operation described above will function properly for a comparand value and match data values of a fixed width (i.e., fixed number of bits). However, some network applications may require looking up values having a variable length. Accordingly, while a conventional CAM may be designed for comparing 64-bit values (words having a 64-bit width), it will not be capable of comparing 128-bit values.

Another more complex network function is that of multiple field matching. For example, certain types of IP data packet processing can essentially reserve a data channel that will be dedicated to a flow of data packets. Such an application can require lookups of more than one field within the packet header. For example, the destination address, source address, and source port may have to be examined to determine a particular flow.

To better understand the limitations of a conventional CAM architecture, a conventional CAM architecture will now be described. Referring now to FIG. 1, a conventional CAM is set forth in a block diagram and designated by the general reference character 100. The conventional CAM 100 is shown to include a number of data word registers 102-0 to 102-n. Data word registers (102-0 to 102-n) will each store a data word that is to be compared to an applied comparand value. A comparand register 104 stores a comparand value that can be applied to data word registers (102-0 to 102-n). Each data word register (102-0 to 102-n) provides a match value (MATCH0-MATCHn). A match value (MATCH0-MATCHn) will be active when its stored data word matches an applied comparand value.

Also included in FIG. 1 is a "filter" circuit 106. The filter circuit 106 receives the match values (MATCH0-MATCHn) and generates corresponding encode values (ENC0 to ENCn). A filter circuit 106 can be used to determine a priority in the event there is more than one active match value (MATCH0-MATCHn). Each encode value (ENC0 to ENCn) is applied to a corresponding output data register (108-0 and 108-n).

In operation, a comparand value that is stored in the comparand register 104 is applied to the data word registers (102-0 to 102-n). For each data word value in a data word register (102-0 to 102-n) that matches an applied comparand value, a match value (MATCH0-MATCHn) will be activated. For example, if the value stored in data word register 102-1 matches the comparand value stored in comparand register 104, the MATCH1 value will be activated.

The filter 106 will filter the match values (MATCH0-MATCHn) to generate an active encode value (ENC0-ENCn). For example, the MATCH1 value can result in the ENC1 value being activated. The active ENC1 value will result in the data stored within output data value register 108-1 being provided as output data.

Thus, a conventional CAM architecture (such as that set forth in FIG. 1) can provide matches between a single, fixed-width comparand value and a number of data words of the same fixed width. However, such a conventional CAM architecture is not capable of providing match functions for words beyond the fixed width, or multiple words.

It would be desirable to provide a CAM that is capable of providing matching functions for multiple word widths. Such a CAM could provide matching capabilities for comparand values beyond a fixed width. Such a CAM could also provide multiple word matching capabilities that may be used in a multiple field matching operation.

SUMMARY OF THE INVENTION

According to the disclosed embodiments, a content addressable memory (CAM) is disclosed that can provide single word match results and multiple word match results.

According to one aspect of the embodiments, a CAM has a single word match mode and a two word match mode. In a single word match mode, comparand values are applied and single word match values generated. In a two word match mode, a first comparand value is applied, and the match results for first word values are stored. A second comparand value is then applied, and the match results for second word values are logically combined with the match results of the stored first word values to generate two word match results.

According to another aspect of the embodiments, a CAM includes a single word match mode and a two word match mode, as described above. In addition, the CAM includes a four word match mode. In a four word match mode, a first comparand value is applied to the CAM, and first match results are stored. A second comparand value is applied and second word match results are also stored. A third comparand value is applied and third word match results are then stored. Finally, a fourth comparand value is applied, and fourth word match results are logically combined with stored first, second and third match values to generate four word match results.

According to another aspect of the disclosed embodiments, a CAM includes a multiple match circuit having a first level circuit block that provides single word match values and a second level circuit block that provides two word match values. The CAM further includes a select circuit that provides either single word match values or two word match values.

According to another aspect of the disclosed embodiments, a CAM includes a multiple match circuit having a first level circuit block and second level circuit block as described above. The multiple match circuit also has a third level circuit block that provides four word match values. The CAM further includes a select circuit that provides either single word match values, two word match values, or four word match values.

DETAILED DESCRIPTION OF THE EMBODIMENTS

Figure 1:
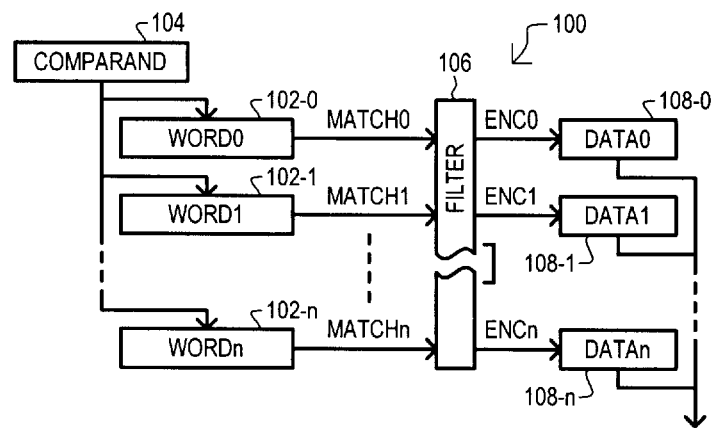
FIG. 1 is a block diagram of a conventional content addressable memory (CAM).
Figure 2:
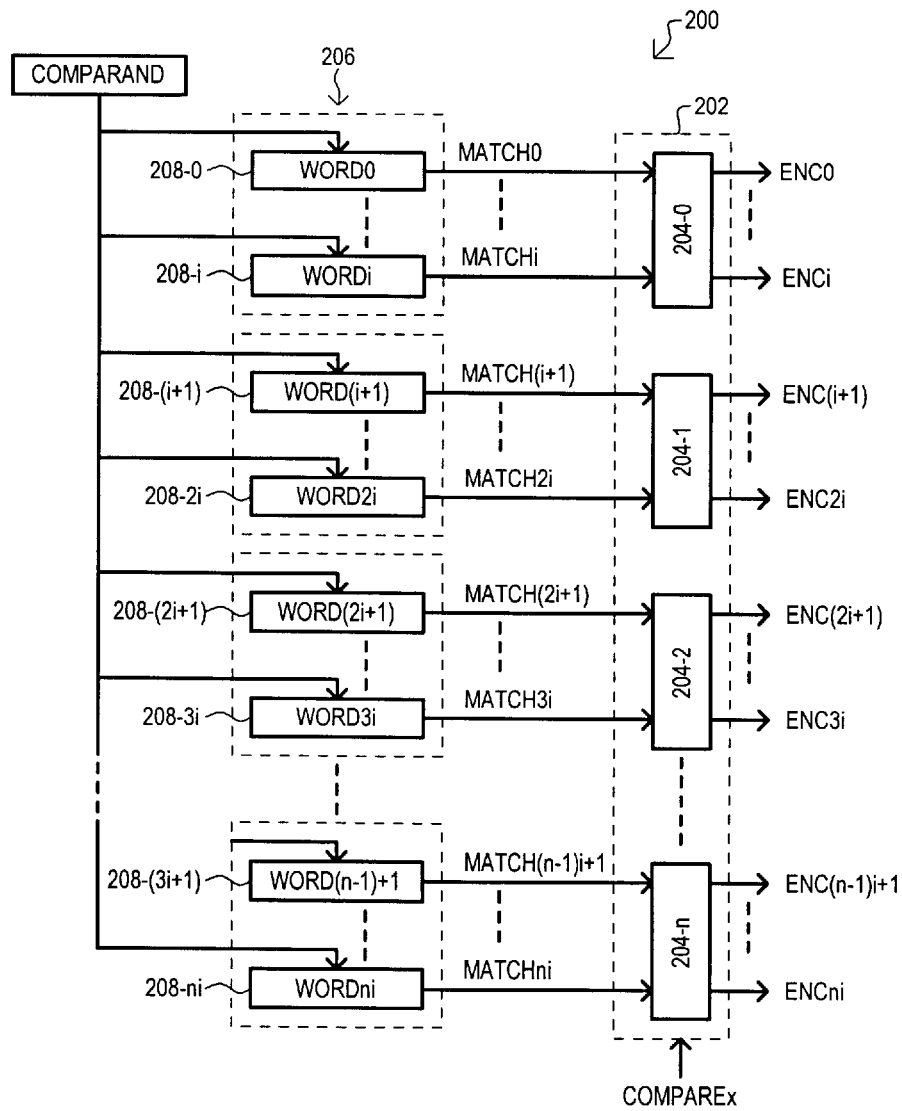
FIG. 2 is a block diagram of a first embodiment.

Various embodiments will now be described in conjunction with a number of diagrams. The various embodiments set forth a content addressable memory (CAM) that can provide multiple word width matching capabilities. Referring now to FIG. 2, a block diagram is set forth illustrating a first embodiment. The first embodiment is designated by the general reference character 200, and is shown to include a match detect circuit 202. The match detect circuit 202 receives a number of word match values (MATCH0-MATCHni) as inputs, and provides a number of encoding values (ENC0-ENCni) as outputs. Unlike a conventional CAM architecture approach, the encoding values (ENC0-ENCni) of the first embodiment can represent not only single word matches, but also multiple word matches.

In the particular arrangement of FIG. 2, the match detect circuit 202 can be conceptualized as including a number of multiple match circuits 204-0 to 204-n. Each multiple match circuit (204-0 to 204-n) can receive a group of word match values and provide an encoded value that indicates when all of the word match values within a group are active. For example, in the particular arrangement of FIG. 2, each multiple match circuit (204-0 to 204-n) receives a group of "i" word match values. The value "i" can be an integer greater than one. In addition, in the particular embodiment of FIG. 2, each multiple match circuit (204-0 to 204-n) provides "i" encoding values. Thus, multiple match circuit 204-0 receives word match values MATCH0-MATCHi, and provides encoding values ENC0-ENCi.

In the first embodiment 200, multiple match circuits (204-0 to 204-n) can have two selectable modes of operation determined according to a COMPAREx control signal. A single match mode of operation generates individual encoding values (ENC0 to ENCni) that correspond to individual word match values (MATCH0-MATCHni). For example, if the MATCH0 value were active, the ENC0 value would be active. In addition to a single match mode of operation, the first embodiment 200 can also provide a multiple match mode of operation. In a multiple match mode of operation, encoding values (ENC0-ENCni) are activated only when predetermined multiple match values (MATCH0-MATCHni) are active. For example, the ENC0 value may be activated only when its corresponding group of match values (MATCH0-MATCHi) are all active. It is noted that it does not necessarily have to the be the first encoding value of a group that indicates a multiple match condition. Any one, or any group, or all of the encoding values ECN0-ENCi may be used to indicate a multiple match condition for the word match values WORD0-WORDi.

The word match values (WORD0-WORDni) are shown to be generated from a word match array 206. The word match array 206 includes a number of word match registers 208-0 to 208-ni. Each word match register (208-0 to 208-ni) stores a data word, and activates a corresponding match value (MATCH0-MATCHni) when its data word matches an applied comparand value.

In a single match mode of operation, a single comparand value is applied to the word match registers (208-0 to 208-ni). If the comparand value matches a stored word value, a word match value (MATCH0-MATCHni) is activated. For example, if the value stored within word match register 208-(i+1) matched an applied comparand value, the MATCH(i+1) value would be activated. In addition, the match detect circuit 202 will activate a single encoding value ENC(i+1).

In a multiple match mode of operation a sequence of comparand values are applied to the word match registers (208-0 to 208-ni). If the sequence of comparand values matches a sequence of stored word values, a sequence of word match values (MATCH0-MATCHni) are activated. For example, if word values stored within word match registers 208-0 to 208-i matched an applied sequence of comparand values, the values MATCH0 to MATCHi would be activated. In addition, multiple match circuit 204-0 would receive the sequence of active values MATCH0 to MATCHi, and activate one or more of the encoding values ENC0-ENCi to indicate a multiple match condition.

Accordingly, the first embodiment 200 set forth in FIG. 2 can provide a single match mode of operation, in which a single match value can generate an active encoding value, and can provide a multiple match mode of operation, in which multiple match values can generate one or more active encoding values.

Figure 3:
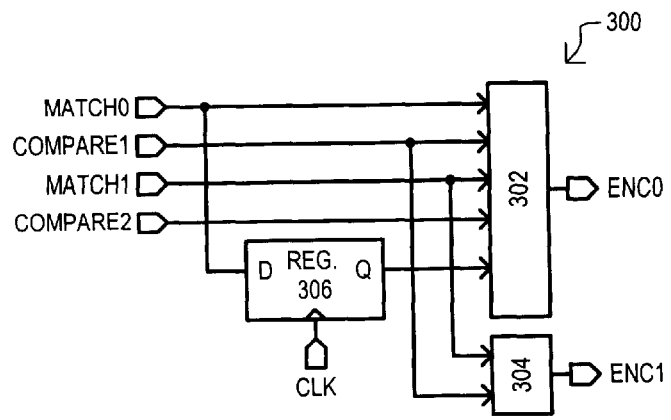
FIG. 3 is block diagram of a multiple match circuit according to a second embodiment.

Having described the general arrangement for a first embodiment 200, a particular multiple match circuit according to a second embodiment will now be described. Referring now to FIG. 3, a selectable multiple match circuit is set forth in a schematic diagram and designated by the general reference character 300. The multiple match circuit 300 receives two word match values, MATCH0 and MATCH1, and provides two encoding values ENC0 and ENC1. The multiple match circuit 300 is selectable between a single match mode and a double word match mode according to a COMPARE1 and a COMPARE2 signal.

The multiple match circuit 300 is shown to include a first logic block 302 and a second logic block 304. The first logic block 302 receives the MATCH0 value directly, and by way of a clocked storage element 306. The first logic block 302 also receives the COMPARE1 and COMPARE2 signals, as well as the MATCH1 value. The second logic block 304 receives the MATCH1 value and the COMPARE1 value.

The first logic block 302 performs a logical function on the received MATCH0 and MATCH1 values to generate the ENC0 value. The particular logical function performed will vary according to the COMPARE1 and COMPARE2 signals. When the COMPARE1 value is active and the COMPARE2 value is inactive, indicating that single word compares are to be performed, the first logic block 302 generates an ENC0 value that varies according to the MATCH0 value. In contrast, when the COMPARE1 value is inactive and the COMPARE2 value is active, indicating that double word compares are to be performed, the first logic block 302 generates an ENC0 value that varies according to both the MATCH1 value and a MATCH0 value provided by the clocked storage element 306.

The second logic block 304 performs a logical function on the received MATCH1 value to generate the ENC1 value. The particular logical function performed will vary according to the COMPARE1 signal. If the COMPARE1 signal is active, the second logic block 304 will output an ENC1 value that varies according to the MATCH1 value.

In a single match mode, the COMPARE1 signal is active and the COMPARE2 signal is inactive. In this arrangement, the MATCH0 value is applied to the first logic block 302 and an ENC0 signal is generated that reflects the MATCH0 value. At the same general time, the MATCH1 value is applied to the second logic block 304 and ENC1 signal is generated that reflects the MATCH1 values. In this way a conventional single word CAM matching operation can be performed. If the data word corresponding to the MATCH0 signal matches an applied comparand value, the MATCH0 signal will be active, resulting in an active ENC0 signal. On the other hand, if the data word corresponding to the MATCH1 signal matches the applied comparand value, the ENC1 signal will be activated.

In a double match mode, the COMPARE1 signal is inactive and the COMPARE2 signal is active. In this arrangement, the MATCH0 value is first applied to, and stored within the clocked storage element 306. While the MATCH0 value is also applied to the first logic block 302 directly, this does not affect the resulting ENC1 value. Subsequently, the MATCH1 value is applied, and at the same general time, the clocked storage element 306 is clocked to output the stored MATCH0 value. Consequently, the first logic block 302 outputs an ENC0 value that reflects both the MATCH0 and the MATCH1 values. In the particular arrangement of FIG. 3, because the COMPARE1 signal is inactive, the ENC1 value output by the second logic block 304 is not affected by the applied MATCH1 value.

Figure 4A:
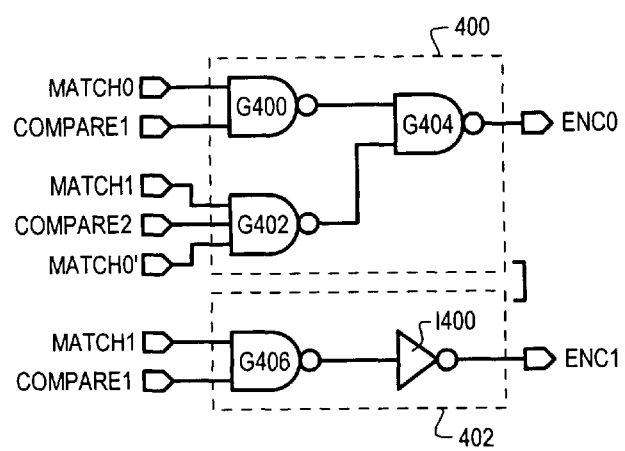
FIGS. 4A and 4B are schematic diagrams of first and second logic blocks that may be used in the embodiment of FIG. 3.
Figure 4B:
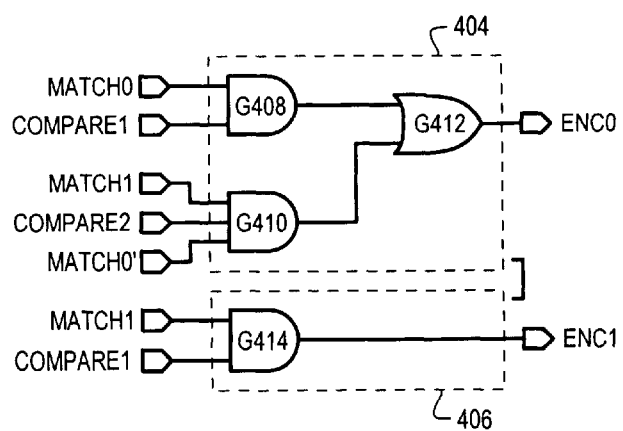

Referring now to FIGS. 4A and 4B, two examples of the many possible ways of implementing the first logic block 302 and second logic block 304 are set forth in a schematic diagram. In the example of FIG. 4A, a first logic block is designated 400 and a second logic block is designated 402. First logic block 400 is shown to include a two-input NAND gate G400 that receives a first word match indication value MATCH0 as one input, and a single word compare mode signal COMPARE1 as another input. A three-input NAND gate G402 receives a second word match indication value MATCH1 as one input, a double word compare mode signal COMPARE2 as another input, and a delayed first word match indication value MATCH0'. The output of gates G400 and G402 are combined as inputs to a two-input NAND gate G404. The output of gate G404 is the ENC0 value.

A second logic block 402 is shown to include a two-input NAND gate G406 that receives the MATCH1 value and the COMPARE1 signal as inputs. The output of gate G406 is inverted by inverter I400 to generate the ENC1 signal.

In operation, when the COMPARE1 and COMPARE2 signals are both low, the first and second logic blocks (400 and 402) provide inactive (low, in the particular example of FIG. 4A) ENC0 and ENC1 values. Within the first logic block 400, with the COMPARE1 and COMPARE2 signals are low, the outputs of gates G400 and G402 are both forced high. Consequently, the output of gate 0404, and hence the ENC0 value, is driven low. Within the s econd logic block 402, the low MATCH1 value forces the output of gate G406 high. This value is inverted by inverter I400 to generate a low ENC1 value.

When the COMPARE1 signal is high and the COMPARE2 signal is low, the resulting ENC0 and ENC1 values follow the MATCH0 and MATCH1 values, respectively. Within the first logic block 400, with the COMPARE1 signal high, gate G400 will provide an output that is the inverse of the MATCH0 value. With the COMPARE2 signal low, the output of gate G402 is forced high, regardless of the other inputs. Consequently, gate G404 will receive one input that is the inverse of the MATCH0 value, and another input that is always high. The output of gate G404 thus follows the MATCH0 value. Within the second logic block 402, the high MATCH1 value forces the output of gate G406 to be the inverse of the MATCH1 value. This value is inverted by inverter I400 to generate an ENC1 value that follows the MATCH1 value. Thus, gate G400 can be conceptualized as providing a first single word match result, and gate G406 can be conceptualized as providing a second single word match result. Both gates G400 and G406 are enabled by the COMPARE1 signal.

When the COMPARE1 signal is low and the COMPARE2 signal is high, the resulting ENC0 value represents the logical combination of the MATCH0 and MATCH1 values. Within the first logic block 400, the low COMPARE1 signal results in the output of gate G400 being forced high. The high COMPARE2 signal applied to gate G402 results in the output of gate G402 depending upon both the MATCH1 and the delayed MATCH0' values. In particular, if the MATCH1 and MATCH0' values are both high, the output of gate G402 will be driven low. However, if either of the MATCH1 or MATCH0' values is low, the output of gate G402 will driven high. In this arrangement, the output of gate G404, will be high if both the MATCH0' and MATCH1 values are high, and low if either of the MATCH0' of MATCH1 values are low. Thus, gate G402 can be conceptualized as providing a multiple word match result, with gate G402 being enabled by the COMPARE2 signal. In addition, gate G404 can be conceptualized as passing either a single word match result or a double word match result according to the COMPARE1 and COMPARE2 signal values.

Referring now to FIG. 4B a second of many possible examples of a first and second logic block are set forth in a schematic diagram. A first logic block is designated by the reference character 404, and is shown to include a two-input AND gate G408 that receives a MATCH0 value and a COMPARE1 signal. In addition, a three-input AND gate G410 receives a MATCH1 value, a COMPARE2 signal, and a MATCH0' value as inputs. The outputs of gates G408 and G410 are supplied as inputs to a two-input OR gate G412. A second logic block is designated by the reference character 406, and is shown to include a two-input AND gate G414 that receives the MATCH1 value and COMPARE1 signal as inputs.

The operation of the logic blocks 404 and 406 generally follows that of 400 and 402. The logic blocks differ from one another in that the example of FIG. 4B provides logic high outputs when enabled. For example, gates G408 and G414 can be conceptualized as providing single word match results. When the COMPARE1 signal is high, gate G408 provides a high output when its MATCH0 value is high, and gate G414 will provide a high output when its MATCH1 value is high. Gate 410 can be conceptualized as providing double word match results. Along these same lines, gate G412 can be conceptualized as passing either a single word match result or a double word match result according to the COMPARE1 and COMPARE2 signal values.

It is understood that embodiments set forth in FIGS. 3, 4A, and 4B represent an example in which word pairs are combined. However, it would be obvious to one skilled in the art that more than two words could be combined to generate multiple word match values of more than two words. To illustrate but one example of such a multiple word matching approach, a third embodiment is set forth in FIG. 5. The third embodiment can provide single word matching results, double (two) word matching results, and quadruple (four) word matching results.

Figure 5:
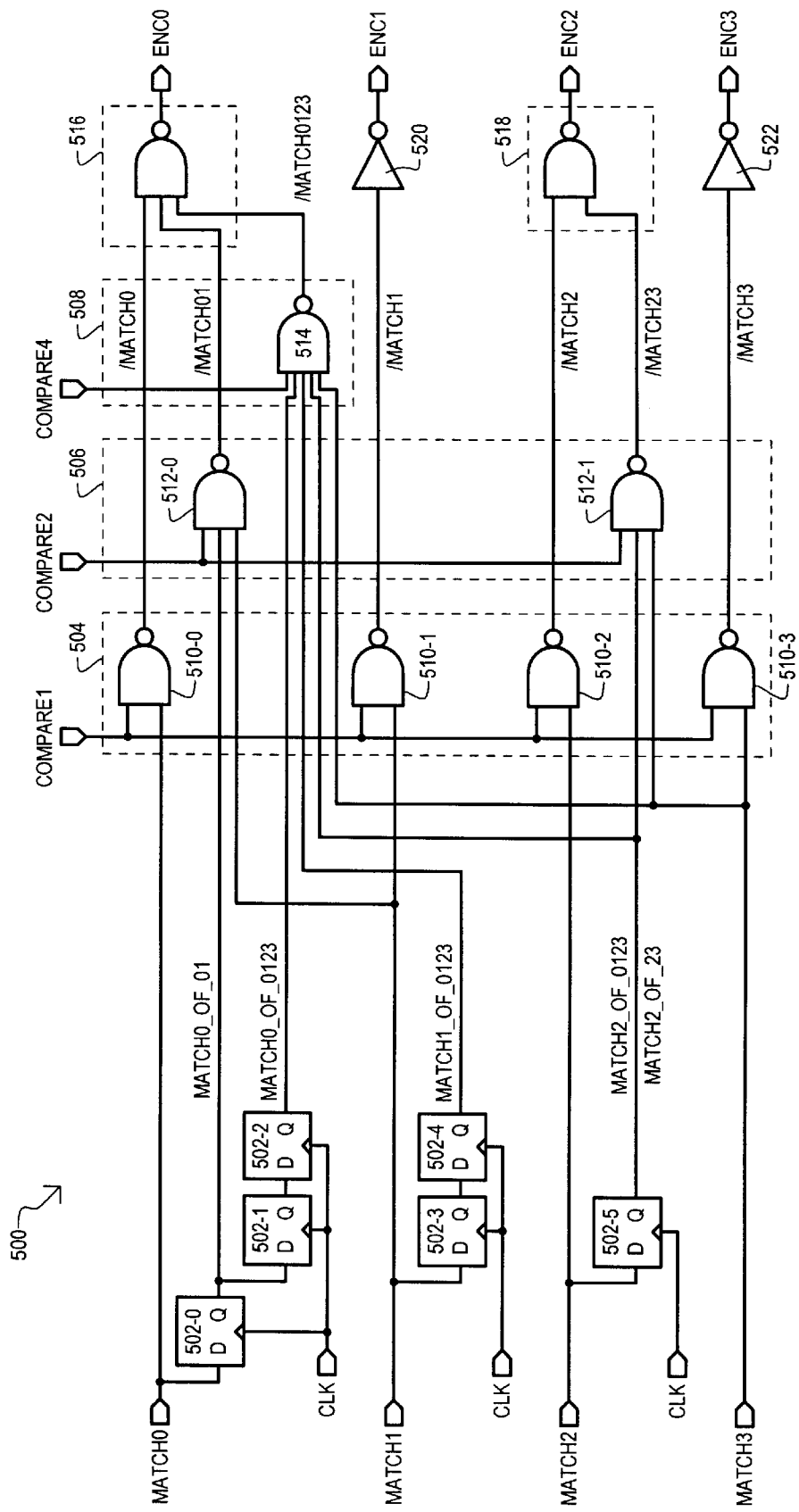
FIG. 5 is a schematic diagram of a third embodiment.

Referring now to FIG. 5, the third embodiment is designated by the general reference character 500, and is shown to receive a four word match values (MATCH0–MATCH3) and provide four encoding values (ENC0–ENC3). The operation of the third embodiment 500 is controlled by a number of control signals, shown as COMPARE1 COMPARE2 and COMPARE4. The control signals (COMPARE1 COMPARE2, COMPARE4) determine how many word match values will be combined to generate the encoding values (ENC0–ENC3). For example, when the COMPARE1 signal is active, while the COMPARE2 and COMPARE4 signals are inactive, the third embodiment 500 provides single word match results. Thus, in the particular arrangement of FIG. 5, in a single word match mode, the ENC0–ENC3 values will follow the MATCH0–MATCH3 values. It is noted that in the particular implementation of FIG. 5, a single word match mode may be established by only the COMPARE1 signal being high, as the COMPARE2 and COMPARE4 signals can actually be in a "don't care" state. That is, the COMPARE2 and COMPARE4 signals can be high, low or at some intermediate logic state.

However, when the COMPARE2 signal is active while the COMPARE1 and COMPARE4 signals are inactive, the third embodiment 500 provides two word match results. Thus, the ENC0–ENC3 values will reflect matches with word pairs. In particular, the ENC0 value will reflect the logical combination of the MATCH0 and MATCH1 values, and the ENC2 value will reflect the logical combination of the MATCH2 and MATCH3 values. It is noted that in the particular implementation of FIG. 5, a two word match mode may be established by only COMPARE1 signal being low and the COMPARE2 signal being high, as the COMPARE4 signals can actually be in a "don't care" state.

Further, when the COMPARE4 signal is active while the COMPARE1 and COMPARE2 signals are inactive, the third embodiment 500 provides four word match results. In particular, the ENC0 value will reflect the logical combination of the MATCH0, MATCH1, MATCH2 and MATCH3 values.

Referring now to FIG. 5, the third embodiment 500 is shown to include a number of clocked storage elements 502-0 to 502-5. The clocked storage elements (502-0 to 502-5) each have an input shown as "D" and an output "Q." In the particular arrangement of FIG. 5, the clocked storage elements (502-0 to 502-5) are controlled by a common timing clock CLK. The clocked storage elements (502-0 to 502-5) will initially store a value at their respective inputs (D), and then, when the CLK signal is active, output the stored value at heir outputs (Q).

Clocked storage element 502-0 is shown to receive the MATCH0 value as an input, and provide a MATCH0_of_01 value as an output. The MATCH0_of_01 value will be combined with a MATCH1 value to generate a /MATCH01 combination value. The /MATCH01 value represents the logical combination of the MATCH0 and MATCH1 values. The MATCH0_of_01 value is applied to clocked storage elements 502-1 and 502-2, which are arranged in series. The output of clocked storage element 502-2 is shown to be a MATCH0_of_0123 value. The MATCH0-of_0123 will be combined with other values to generate a /MATCH0123 combination value. The /MATCH0123 value represents the logical combination of the MATCH0, MATCH1, MATCH2 and MATCH3 values.

The MATCH1 value is applied as an input to clocked storage elements 502-3 and 502-4, which are arranged in series, to generate a MATCH1_of_0123 value. The MATCH1_of_0123 value will be combined with a MATCH0_of_0123 value and other values, to generate the /MATCH0123 value.

The MATCH2 value is applied as an input to clocked storage element 502-5. The resulting output of clocked storage element 502-2 is a MATCH2_of_0123 value. The MATCH2_of_0123 value will be combined with the MATCH0_of_0123 value, the MATCH1_of_0123 value, and the MATCH3 value to generate the /MATCH0123 value. The output of clocked storage element 502-5 can also be considered a MATCH2_of_23 value. The MATCH2_of_23 value will be combined with the MATCH3 value to generate a /MATCH23 combination value. The /MATCH23 value represents the logical combination of the MATCH2 and MATCH3 values.

The particular arrangement of the third embodiment 500 includes various circuit blocks for generating various levels of combination values. In particular, a first level circuit block 504 provides lowest level values. The lowest level values in the particular arrangement of FIG. 5 are the word match values themselves (WORD0–W0RD3). A second circuit block 506 provides a second level of values. The second level values in the particular arrangement of FIG. 5 are combinations of two word match values (WORD0/WORD1 and WORD2/WORD3). A third circuit block 508 provides a third level of values. The third level values in the particular arrangement of FIG. 5 are combinations of four word match values (MATCH0/MATCH1/MATCH2/MATCH3).

The first level circuit block 504 is shown to include a number of first level gate circuits 510-0 to 510-3. The first level gate circuits (510-0 to 510-3) pass on word match values (MATCH0–MATCH3) to generate encoding values (ENC0–ENC3). In the particular arrangement of FIG. 5, the first level gates circuits (510-0 to 510-3) are controlled by a first control signal COMPARE1. Further, the first level gate circuits (510-0 to 510-3) are two-input NAND gates that receive a word match value (WORD0–WORD3) as one input, and the COMPARE1 signal as another input. In this arrangement, when the COMPARE1 signal is high, the first level gates (510-0 to 510-3) output the inverse of their respective word match values (WORD0–WORD3). Of course, the particular use of NAND gates should not be construed as limiting the invention thereto. As illustrated by FIGS. 4A and 4B, just one possible variation could be an AND gate. Another of the many possible variation could include as one part, a transfer gate circuit. Accordingly, the first level gate circuits (510-0 to 510-3) can be subject to considerable variation.

The second level circuit block 506 is shown to include a number of second level gate circuits 512-0 to 512-1. The second level gate circuits (512-0 to 512-1) combine a first number of word match values (MATCH0_of_01/MATCH1 and MATCH2_of_23/MATCH3) and pass on combination values (/MATCH01 and /MATCH23). In the particular arrangement of FIG. 5, the second level gates circuits (512-0 to 512-1) are three-input NAND gates that are controlled by a second control signal COMPARE2. The three-input NAND gates each receive two word match values (MATCH0_of_01/MATCH1 and MATCH2_of_23/ WORD3) and the control signal COMPARE2. In this arrangement, provided the COMPARE2 signal is high, the second level gate circuits (512-0 and 512-1) will output the logical product of their respective two word match values. Of course, as mentioned in conjunction with the first level gate circuits (510-0 and 510-3), the particular use of NAND gates is but one of many possible implementations, and should not be construed as limiting the invention thereto. As just one example, more than one logic gate could be used to implement the second level gate circuits (512-0 and 512-1).

The third level circuit block 508 is shown to include a third level gate circuit 514. The third level gate circuit 514 combines a second number of word match values (MATCH0_of_0123, MATCH1_of_0123, MATCH2_of_0123, and MATCH3) and passes on a combination value. In the particular arrangement of FIG. 5, the number of word match values combined by the third level gate circuit 514 is four. Further, the third level gate circuit 514 is a five-input NAND gate that is controlled by a third control signal COMPARE4. In this arrangement, provided the COMPARE4 signal is high, the third level gate circuit 514 will output the logical product of the four word match values (MATCH0_of_0123, MATCH1_of_0123, MATCH2_of_0123, and MATCH3). Like the first level gate circuits (510-0 and 510-3) and second level gate circuits (512-0 and 512-1), the third level gate circuit 514 is but one of many possible implementations, and should not be construed as limiting the invention thereto.

The arrangement of the third embodiment 500 provides encoding values (ENC0–ENC3) that can represent single word match values (MATCH0–MATCH3), two word match values (MATCH01 and MATCH23), or a four word match value (MATCH0123). In particular, the arrangement provides an ENC0 value that can represent the single word match value MATCH0, the two word match value MATCH01, or the four word match value MATCH0123. The ENC1 value can represent the single word value MATCH1. The ENC2 value can represent the single word value MATCH2 or the double word value MATCH23. The ENC3 value can represent the single word value MATCH3.

The third embodiment 500 includes a first select circuit 516 that selects among the possible values /MATCH0, /MATCH01 and /MATCH0123, to output an ENC0 value. In the arrangement of FIG. 5, the first select circuit 516 includes a three-input NAND gate 516. One input receives the /MATCH0 value from first level gate circuit 510-0. A second input receives the /MATCH01 value from the second level gate circuit 512-0. A third input receives the /MATCH0123 value from the third level gate circuit 514. Accordingly, when the /MATCH01 and /MATCH0123 values are high, the ENC0 value will be the inverse of the /MATCH0 value. Similarly, when the /MATCH0 and /MATCH0123 values are high, the ENC0 value will be the inverse of the /MATCH01 value. Finally, when the /MATCH0 and /MATCH01 values are high, the ENC0 value will be the inverse of the /MATCH0123 value. As in the case of the first, second, and third level gate circuits (510-0 to 510-3, 512-0 and 512-1 and 514), the first select circuit 516 can be subject to considerable variation.

The third embodiment 500 further includes a second select circuit 518. The second select circuit 518 selects between the /MATCH2 and /MATCH23 to provide the ENC2 value. In the arrangement of FIG. 5, the second select circuit 518 includes a two-input NAND gate 518. One input receives the /MATCH2 value from first level gate circuit 510-2, while the other input receives the /MATCH23 value from the second level gate circuit 512-1. Accordingly, when the /MATCH2 value is high, the ENC2 value will be the inverse of the /MATCH2 value. Similarly, when the /MATCH23 value is high, the ENC2 value will be the inverse of the /MATCH23 value. Like the first select circuit 516, the use of a NAND gate in the second select circuit 518 should not be construed as limiting the invention thereto.

As shown in FIG. 5, the third embodiment 500 is shown to further include two inverters 520 and 522. Inverter 520 inverts the /MATCH1 value received from first level gate circuit 510-1 to provide a MATCH1 value as the ENC1 value. In a similar fashion, inverter 522 inverts the /MATCH3 value received from the first level gate circuit 510-3 to provide a MATCH3 value as the ENC3 value.

The third embodiment 500 operates according to the applied clock signal CLK and the control signals COMPARE1, COMPARE2 and COMPARE4. In a single word compare mode, the COMPARE1 signal will be high. If COMPARE1=1, the COMPARE2 and COMPARE4 signals are "don't care" values.

A single word compare operation will also include the application of a comparand value, and the generation of the MATCH0–MATCH3 values. The MATCH0 value will be applied to the first level gate circuit 510-0, the MATCH1 value will be applied to the first level gate circuit 510-1, the MATCH2 value will be applied to the first level gate circuit 510-2, and the MATCH3 value will be applied to the first level gate circuit 510-3. Because the COMPARE1 signal and the /MATCH01 and /MATCH0123 values are high, the MATCH0 value will propagate through the first level gate circuit 510-0 and first select circuit 516 to generate the ENC0 value. Also due to the high COMPARE1 signal, the MATCH1 value will propagate through first level gate circuit 510-1 and inverter 520 to generate the ENC1 value. Because the COMPARE1 signal and the /MATCH23 values are high, the MATCH2 value will propagate through first level gate circuit 510-2 and second select circuit 518 to generate the ENC2 value. Finally, due to the high COMPARE1 signal, the MATCH3 value will propagate through first level gate circuit 510-3 and inverter 522 to generate the ENC3 value.

In a two word compare mode, the COMPARE2 signal is high, while the COMPARE1 and COMPARE4 signals are low. With the COMPARE1 and COMPARE4 signals low, the /MATCH0, /MATCH1, /MATCH2, /MATCH3 and /MATCH0123 values will be high.

A two word compare operation will also include the application of a first comparand value, and the generation of a first set of MATCH0–MATCH3 values. The MATCH0 value will initially be stored within clocked storage element 502-0 and the MATCH2 value will initially be stored within clocked storage element 502-5. The MATCH0 and MATCH2 values will be the comparison results for the first word of two word pairs.

On a subsequent high CLK signal cycle, a second comparand value can be applied to generate a second set of MATCH0–MATCH3 values. The MATCH1 and MATCH3 values will be the comparison results for the second word of two word pairs. The MATCH1 value will be applied as one input to the second level compare circuit 512-0 and the MATCH3 value will be applied as one input to the third level compare circuit 512-1. Also on the subsequent high clock cycle, the MATCH0 value will be output from the clocked storage element 502-0 and applied as a second input to the second level gate circuit 512-0. At the same time, the MATCH2 value will be output from the clocked storage element 502-5 and applied as a second input to the second level gate circuit 512-1. Because the COMPARE2 signal is high, the first level gate circuit 512-0 will output the logical product of the MATCH0 and MATCH1 value as the /MATCH01 value, and the second level gate circuit 512-1 will output the logical product of the MATCH2 and MATCH3 as the /MATCH23 value. Because the /MATCH0 and /MATCH0123 values are high, the MATCH01 value will propagate through first select circuit 516 to generate the ENC0 value. In addition, because the /MATCH2 value is high, the MATCH23 value will propagate through second select circuit 518 to generate the ENC2 value.

In a four word compare mode, the COMPARE4 signal is high, while the COMPARE1 and COMPARE2 signals are low. With the COMPARE1 and COMPARE2 signals low, the /MATCH0, /MATCH1, /MATCH2, /MATCH3, /MATCH01, and /MATCH23 values will be high. A four word compare operation will also include the application of a first comparand value. The first comparand value will generate a first set of MATCH0–MATCH3 values. The MATCH0 value will be initially stored within clocked storage element 502-0. The MATCH0 value will be the comparison results for a first word of a four word group.

On a first subsequent high CLK signal cycle, the MATCH0 value will be output from the clocked storage element 502-0 and stored within clocked storage element 502-1. At the same time, a second comparand will be applied to generate a second set of MATCH0–MATCH3 values. The MATCH1 value from this set will be stored in the clocked storage element 502-3. The MATCH1 value will be the comparison result for a second word of a four word group.

On a second subsequent high CLK signal cycle, the MATCH0 value will propagate from the clocked storage element 502-1 and be stored within clocked storage element 502-2. The MATCH1 value will propagate from the clocked storage element 502-3 and be stored within clocked storage element 502-4. In addition, a third comparand value will be applied and will generate a third set of MATCH0–MATCH3 values. The MATCH2 value for this set will be stored within clocked storage element 502-5. The MATCH2 value will be the comparison result for a third word of a four word group.

On a third subsequent high CLK signal cycle, a MATCH3 value will be applied. The MATCH3 value will be the comparison result for a fourth word of a four word group. The MATCH3 value will be applied as one input to the third level gate circuit 514. At the same time, the MATCH0_of_0123, MATCH1_of_0123 and MATCH2_of_0123 values will be applied as inputs to the third level gate circuit 514 from clocked storage elements 502-2, 502-4 and 502-5. With the COMPARE4 signal high, the logical product of the MATCH0_of_0123, MATCH1_of_0123, MATCH2_of_0123, and MATCH3 values will be output as the /MATCH0123 value. Further, because the /MATCH0 and /MATCH01 values are high, the /MATCH0123 value will propagate through (and be inverted by) first select circuit 516. The ENC0 value will thus represent the comparison of four word values.

It is noted that in the two word compare case, the COMPARE1) COMPARE2 and COMPARE4 values do not have to be limited to particular values as the MATCH0 value is stored in clocked storage element 502-0. Similarly, the COMPARE1) COMPARE2 and COMPARE4 values do not have to be limited to particular values as the MATCH0 value is stored in clocked storage elements 502-0 to 502-2, as the MATCH1 value is stored in clocked storage elements 502-3 to 502-4, and as the MATCH3 value is stored in clocked storage element 502-5.

In this manner, the third embodiment 500 utilizes a common clock CLK and a series of clocked storage registers (502-0 to 502-5) to essentially delay selected word match values (MATCH0–MATCH2). The delayed word match values can then be applied simultaneously to higher level circuit blocks (506 and 508) to generate combination values (/MATCH01, /MATCH23 and /MATCH0123).

Figure 6:
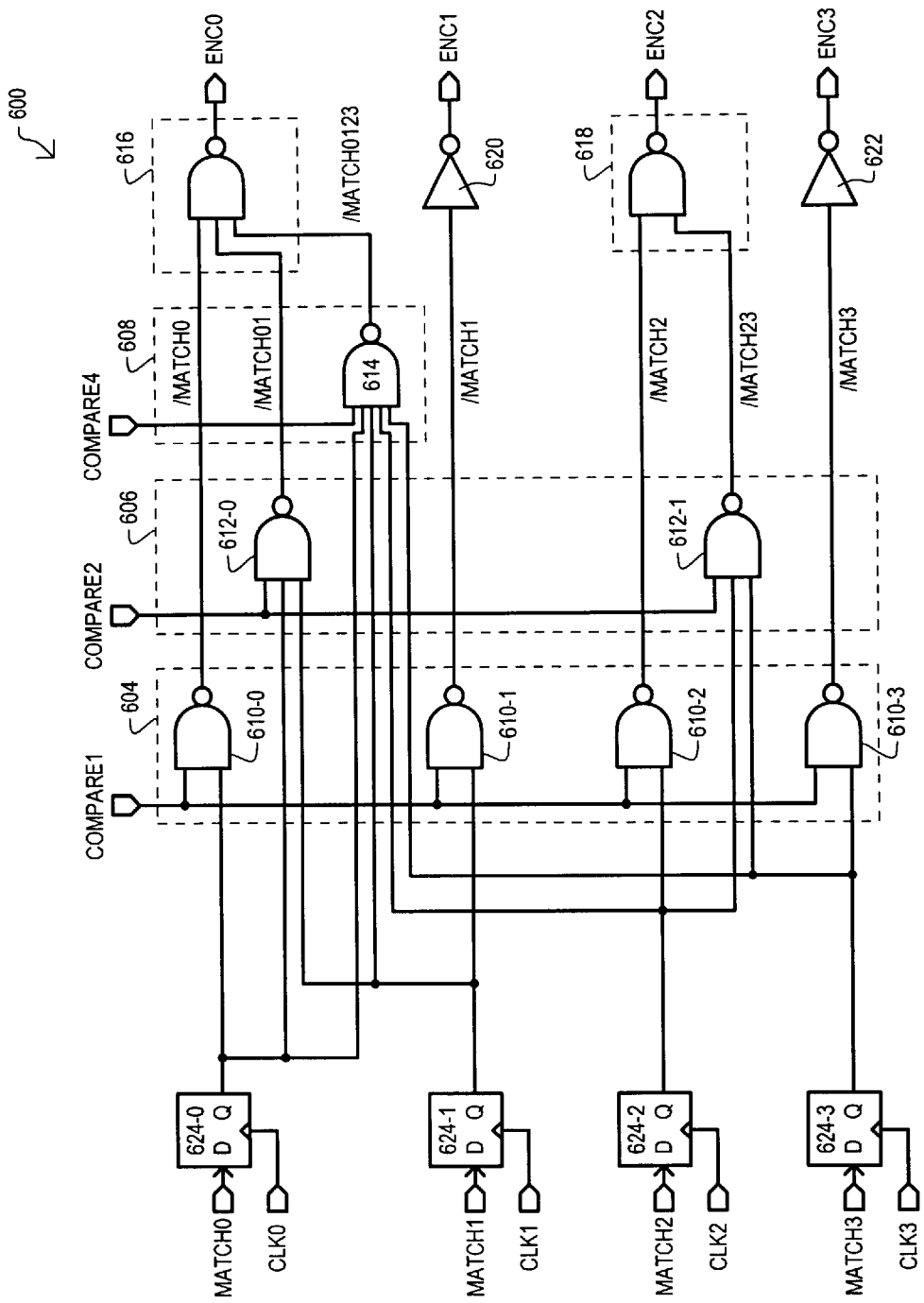
FIG. 6 is a schematic diagram of a fourth embodiment.

Referring now to FIG. 6, a fourth embodiment is set forth in a schematic diagram and designated by the general reference character 600. The fourth embodiment 600 includes some of the same general constituents as the third embodiment 500. Accordingly, like constituents will be referred to by the same reference character, but with the first digit of the reference numeral being a "6" instead of a "5."

The fourth embodiment 600 receives four word match values MATCH0–MATCH3, and provides four encoding values ENC0–ENC3. The fourth embodiment 600 is selectable between a single word match mode, a two word match mode, or a four word match mode. As in the third embodiment 500, in the single word match mode the fourth embodiment 600 provides encoding values ENC0–ENC3 that each represents a match result of a single word. In the double word match mode, encoding values ENC0 and ENC2 each represent a match result for two consecutive words. In the four word match mode, encoding value ENC0 represents a match result for four consecutive words.

The fourth embodiment 600, unlike the third embodiment 500, utilizes a number of different clocks CLK0–CLK3 instead of one clock CLK. The different clocks (CLK0–CLK3) are applied to corresponding input clocked registers 624-0 to 624-3. Input clocked registers 624-0 to 624-3 receive word match values MATCH0–MATCH3, respectively. Values stored within the input clocked registers (624-0 to 624-3) are output in response to their respective clocks (CLK0–CLK3).

The MATCH0 value output from input clocked register 624-0 is applied as an input to a first level gate circuit 610-0 within a first level circuit block 604, as an input to a second level gate circuit 612-0 within a second level circuit block 606, and as an input to a third level gate circuit 614 within a third level circuit block 608. The MATCH1 value output from input clocked register 624-1 is applied as an input to a first level gate circuit 610-1 within first level circuit block 604, as an input to second level gate circuit 612-0 within second level circuit block 606, and as an input to third level gate circuit 614 within third level circuit block 608. The MATCH2 value output from input clocked register 624-2 is applied as an input to a first level gate circuit 610-2 within first level circuit block 604, as an input to a second level gate circuit 612-1 within second level circuit block 606, and as an input to third level gate circuit 614 within third level circuit block 608. The MATCH3 value output from input clocked register 624-3 is applied as an input to a first level gate circuit 610-3 within first level circuit block 604, as an input to second level gate circuit 612-1 within second level circuit block 606, and as an input to third level gate circuit 614 within third level circuit block 608.

First level gate circuits (610-0 to 610-3) each receive the COMPARE1 signal as an input, second level gate circuits (612-0 and 612-1) each receive the COMPARE2 signal as an input, and the third level gate circuit 614 receives the COMPARE4 signal as an input. In this arrangement, when the COMPARE1 signal is active (high), the first level gate circuits 610-0 to 610-3 output values that follow the MATCH0–MATCH3 values, respectively. When the COMPARE2 signal is active (high), second level gate circuit 612-0 outputs the logical combination of the MATCH0 and MATCH1 values, while second level gate circuit 612-1 outputs the logical combination of the MATCH2 and MATCH3 values. Further, an active COMPARE4 signal results in the third level gate circuit 614 providing a value representing the combination of the MATCH0–MATCH3.

A first select circuit 616 can receive a single word match value /MATCH0 from first level gate circuit 610-0, a two word match value /MATCH01 from second level gate circuit 612-0, or a four word match value /MATCH0123 from a third level gate circuit 614. In response to the various inputs, first select circuit 616 outputs the ENC0 value. In addition, a second select circuit 618 can receive a single word match value /MATCH2 from first level gate circuit 610-2 or a two word match value /MATCH23 from second level gate circuit 612-1. In response to its various inputs, the second select circuit 618 outputs the ENC2 value. In addition, the output of first level gate circuit 610-1 is inverted by inverter 620 to generate the ENC1 value, and the output of first level gate circuit 610-3 is inverted by inverter 622 to generate the ENC3 value.

Having described the general arrangement of a fourth embodiment 600, the operation of the fourth embodiment will now be described in conjunction with a series of timing diagrams set forth in FIGS. 7A–7C.

Figure 7A:
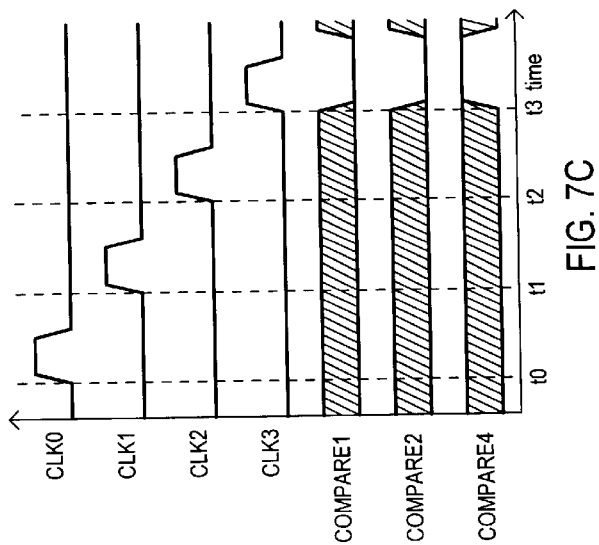
FIGS. 7A–7C are timing diagrams illustrating the operation of the fourth embodiment.
Figure 7B:
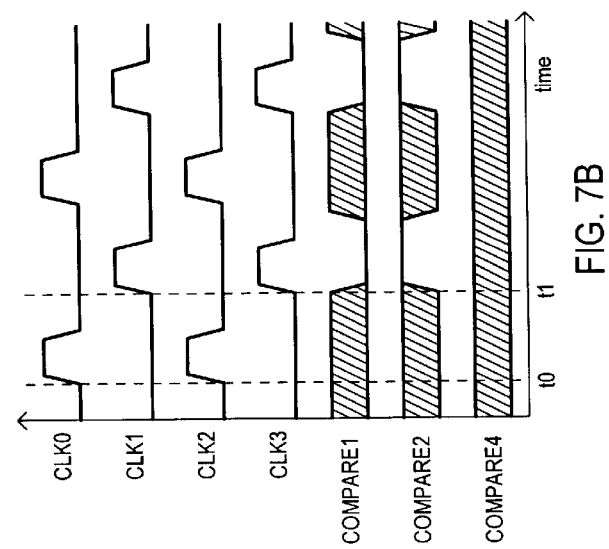
Figure 7C:
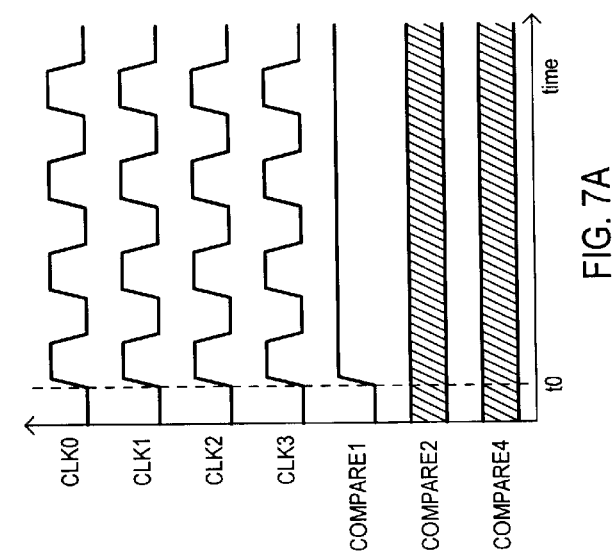

Each of the timing diagrams of FIGS. 7A–7C set forth the clock signals CLK0–CLK3 and the compare signals COMPARE1) COMPARE2 and COMPARE4. The timing diagram of FIG. 7A represents a single word match mode of operation that will provide encoding values ENC0–ENC3 that reflect the values of four word match values MATCH0–MATCH3. The timing diagram of FIG. 7B represents one particular two word match mode of operation. Accordingly, the operation illustrated by FIG. 7B can provide an encoding value ENC0 that reflects a match between two word match values (MATCH0 and MATCH1), and an encoding value ENC2 that reflects a match between a different pair of word values (MATCH2 and MATCH3). The timing diagram of FIG. 7C represents one particular four word match mode of operation. Thus, the operation illustrated by FIG. 7C can provide an ENC0 value that reflects a match between four word match values (MATCH0–MATCH3).

Referring now to FIG. 6 in conjunction with FIG. 7A, it is shown that at time to, the clock signals CLK0–CLK3 transition to an active level (high in the particular example of FIG. 7A) at the same time the COMPARE1 signal is high. The COMPARE2 and COMPARE4 signals are in a "don't care" state. This arises from the particular implementation of FIG. 6 which, like the implementation of FIG. 5, can be placed into a single word match mode by an active (logic high) COMPARE1 signal.

With the COMPARE1 signal high, first level gate circuits 610-0 to 610-3 are enabled. Accordingly, when the CLK0–CLK3 signals transition high, the MATCH0–MATCH3 values will be output from input clocked registers 624-0 to 624-3, and applied as inputs to the first level gate circuit 610-0 to 610-3, respectively. Due to the particular logic arrangement of the fourth embodiment 600, the MATCH0 value will propagate through the first level gate circuit 610-0 and first select circuit 616 to provide the ENC0 signal. At the same time, the MATCH1 value will propagate through first level gate circuit 610-1 and inverter 620 to provide the ENC1 signal. Due to the particular arrangement of FIG. 6, the MATCH2 signal will propagate through the first level gate circuit 610-2 and second select circuit 618 to provide the ENC2 value. In addition, the MATCH3 value will propagate through first level gate circuit 610-3 and inverter 622 to provide the ENC3 signal. In this way, in the single word match mode, the fourth embodiment 600 provides four encoding values ENC0–ENC3 in response to the four simultaneous clock signals CLK0–CLK3.

Referring now to FIG. 6 in conjunction with FIG. 7B, it is shown that at time t0, the clock signals CLK0 and CLK2 transition to an active level while clock signals CLK1 and CLK3 remain at an inactive level. The COMPARE1 COMPARE2 and COMPARE4 signals can have "don't care" values. In response to the active CLK0 and CLK2 signals, the MATCH0 and MATCH2 values are output from the input clocked registers 624-0 and 624-2 and applied to second level gate circuits 612-0 and 612-1.

At time t1, the clock signals CLK1 and CLK3 transition to an active level while clock signals CLK0 and CLK2 transition to inactive levels. Also at time t1, the COMPARE1 signal is low while the COMPARE2 signal is high. As noted above, in the particular arrangement of FIG. 6, the COMPARE4 signal value will not impact the resulting ENC0–ENC3 values, thus the COMPARE4 signal is shown in the "don't care" state. With the COMPARE1 signal low, the first level gate circuits (610-0 to 610-3) are disabled, and will only output high logic values. Thus, at time t1, second level gate circuit 612-0 will receive the MATCH0 value previously clocked out of input clocked register 624-0 and the MATCH1 value clocked out of input clocked register 624-1 at time t1. Further, second level gate circuit 612-2 will receive the MATCH2 value previously clocked out of input clocked register 624-2 and the MATCH3 value clocked out of input clocked register 624-3 at time t3.

Thus, at time t1, second level gate circuit 612-0 generates the logical product of the MATCH0 and MATCH1 values to generate a MATCH01 combination value. The MATCH01 combination value propagates through first select circuit 616 to provide the ENC0 value. Generally simultaneously, second level gate circuit 612-1 generates the logical product of the MATCH2 and MATCH3 values to generate a MATCH23 combination value. The MATCH23 combination value propagates through second select circuit 618 to provide the ENC2 value. In this way, in a double word match mode, the fourth embodiment 600 first stores two word match values (MATCH0 and MATCH2) and then clocks in two more word values (MATCH1 and MATCH3) to combine pairs of word values.

Referring now to FIG. 6 in conjunction with FIG. 7C, it is shown that at time t0, the clock signal CLK0 transitions to an active level, while clock signals CLK1–3 remain at inactive levels. The COMPARE1) COMPARE2 and COMPARE4 signals can have "don't care" values. In response to the active CLK0 signal, a MATCH0 value is output from input clocked register 624-0 and applied to third level gate circuit 614.

At time t1, the clock signal CLK1 transitions to an active level, while clock signals CLK0, CLK2 and CLK3 are at inactive levels. The COMPARE1) COMPARE2 and COMPARE4 signals can remain at any logic state, and so are shown in the "don't care" state. The active (high) CLK1 signal results in a MATCH1 value being output from input clocked register 624-1 and applied to third level gate circuit 614.

At time t2, the clock signal CLK2 transitions to an active level, while clock signals CLK0, CLK1 and CLK3 are at inactive levels. The COMPARE1 COMPARE2 and COMPARE4 signals are shown to remain at the "don't care" state. The active CLK2 signal results in a MATCH2 value being output from input clocked register 624-2 and applied to third level gate circuit 614.

At time t3, the clock signal CLK3 transitions to an active level, while clock signals CLK0–CLK2 are at inactive levels. The active CLK3 signal results in a MATCH3 value being output from input clocked register 624-3 and applied to third level gate circuit 614. At the same time, the COMPARE1 and COMPARE2 signals are at an inactive level (low), while the COMPARE4 signal is at an active level (high). The low COMPARE1 signal essentially disables the first level gate circuits (610-0 to 610-3), forcing their outputs high. In a similar fashion, the low COMPARE2 signal essentially disables the second level gate circuits (612-0 to 612-1), forcing their outputs high.

However, also at time t3, the high COMPARE4 signal enables the third level gate circuit 514. As noted above, a MATCH0 signal has been previously applied to the third level gate circuit 614 at time t0, a MATCH1 signal has been previously applied to the third level gate circuit 614 at time t1, and a MATCH2 signal has been previously applied to the third level gate circuit 614 at time t2. Thus, with the application of the MATCH3 signal at time t3, the third level gate circuit 614 generates a combination value /MATCH0123 that is the logical product of the MATCH0, MATCH1, MATCH2 and MATCH3 values. The combination value /MATCH0123 propagates through (and is inverted by) the first select circuit 616 to provide an ENC0 value that represents a four word compare indication. In this way, in a four word match mode, the fourth embodiment 600 a first word match value MATCH0 is stored in response to a first clock signal CLK0, a second word match value MATCH1 is stored in response to a second clock signal CLK1, a third word match value MATCH2 is stored in response to a third clock signal CLK2, and a fourth word match value MATCH3 is then clocked in, and the four word match values (MATCH0–MATCH3) are combined to generate a four word match value /MATCH0123.

Figures 8, 9A, 9B, 9C:
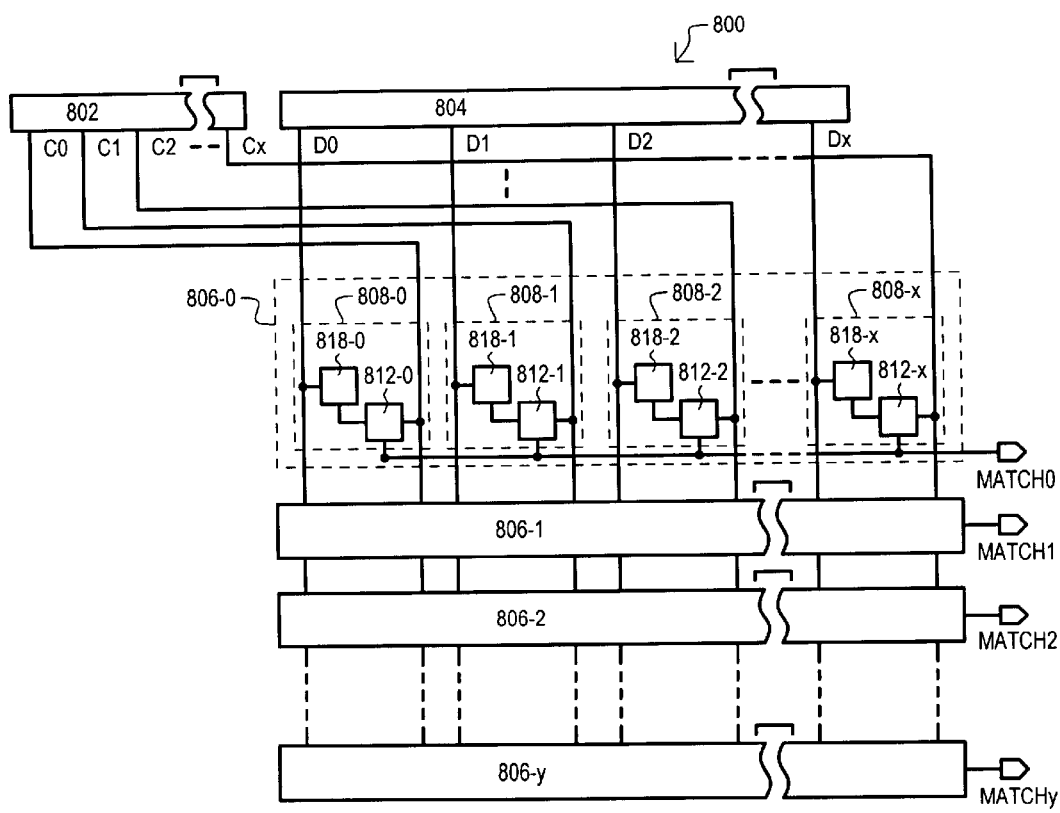
FIG. 8 is a block diagram of a CAM compare structure that can generate word match values.
FIGS. 9A–9C are tables illustrating arrangements of word values according single, two, and four word match modes of operation.

Referring now to FIG. 8, a content addressable memory (CAM) compare structure is set forth in a block schematic diagram. The CAM compare structure is designated by the general reference character 800 and is shown to include a word input register 802 and a comparand input register 804. The word input register 802 allows word values to be loaded into word registers 806-0 to 806-y. The comparand register 802 allows a comparand value to be applied to the word registers 806-0 to 806-y. In response to an applied comparand value, each word register 806-0 to 806-y will generate a word match value, shown as MATCH0-MATCHy.

One particular structure of a word register 806-0 is set forth in detail in FIG. 8. Word register 806-0 is shown to include a number of CAM cells 808-0 to 808-x, each of which includes a bit register 810-0 to 810-x and a compare circuit 812-0 to 812-x. Bit registers (810-0 to 810-x) store the bits of a loaded word value, and apply the stored value as one input 5 to a compare circuit (812-0 to 812-x). Another input to the compare circuits (812-0 to 812-x) is a comparand bit value provided from the comparand input register 804. If all of the stored bits of a loaded word value match the bits of an applied comparand value, the corresponding match indication (MATCH0-MATCHy) will be activated. The match indications (MATCH0-MATCHy) can then be processed as described above.

During the operation of a CAM compare structure, such as that set forth in FIG. 8, a sequence of comparand values will be applied. In a single word match mode, a sequence of comparand values will received by the comparand input register 802. Single word match results will then be generated. In a two word match mode, a first word of a two word group will be applied followed by a second word of the two word group. Finally, in a four word match mode, a sequence of four words will be applied to the comparand input register 802.

A compare structure can have data words stored in a particular fashion according to the mode of operation. One example is set forth in FIGS. 9A to 9C. Each table sets forth a number of word registers identified by their location in a particular order within a CAM array (locations 0–9). Corresponding to each location is a word value. The word values are generally identified as WORDkj, where the value k indicates a particular grouping, and the value j represents an order in a group.

FIG. 9A represents one example of word data values stored according to a single word match mode of operation. The word data values can be conceptualized as belonging to the same group, and so each include a "k" value of zero.

FIG. 9B represents one example of word data values stored according to a two word match mode of operation. Accordingly, the word data values can be conceptualized as being arranged into groups of two. Thus, in the particular arrangement of FIG. 9B, each two consecutive locations will store corresponding pairs of data words that are to be compared to applied pairs of comparand values.

FIG. 9C represents one example of word data values stored according to a four word match mode of operation. Accordingly, the word data values can be conceptualized as being arranged into groups of four. Thus, in the particular arrangement of FIG. 9C, four consecutive locations will store a corresponding group of four data words that are to be compared to an applied sequence of four comparand values.

It is understood that the use of the term "word" is in not intended to limit the number of bits in a stored word to a particular number. Thus, a word can include a variable number of bits. In addition, as will be described in more detail below, multiple word matches of variable word lengths are possible.

The various clock signals described can be generated in response to an external system clock signals, however, such an arrangement should not be construed as limiting. As just one example, clock signals can be generated in response to transitions in an applied input values, such as a comparand value.

While a various portions of the described embodiment can be implemented on a number of distinct integrated circuits, a single integrated circuit containing the majority of the portions would provide advantageous speeds, as less capacitance must be driven. Further, such a single integrated circuit solution can have a smaller manufacturing cost. Particular arrangements which can be cost-effective and have a rapid operating speed, could be a single integrated circuit that includes a CAM compare structure, such as that set forth in FIG. 8, and a multiple match circuit, such as those set forth in FIGS. 3, 5 or 6.

It is further noted that the various encoding values described could be "directly" encoding values, which provide an output value when activated. In addition, encoding values can be "indirectly" encoding values, in which additional filtering of encoding values can occur.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A content addressable memory (CAM), comprising: a plurality of CAM cells that provide a plurality of match indications; a storage circuit for storing predetermined match indications, wherein the predetermined match indications are first, second, third, and fourth word match values; a first level circuit block for logically combining the first and second word match values to generate two word match indications, the first level circuit block being enabled by a first multiple match mode indication; and a second level circuit block that logically combines said first, second, third, and fourth word match values and generates four word match indications, the second level circuit block being enabled by a second multiple match mode indication.

2. The CAM of claim 1, wherein:
each CAM cell includes a storage register and a compare circuit.

3. The CAM of claim 2, wherein:
the CAM cells are arranged into an array having rows and columns, and selected CAM cells further include a compare circuit that receives a comparand value.

4. The CAM of claim 1, wherein:
the storage circuit includes first clocked registers that store first word match results.

5. The CAM of claim 1, wherein:
the storage circuit includes
a plurality of first storage latch series that couple said fourth word match values to a third level circuit block, each first storage latch series including at least three clocked registers,
a plurality of second storage latch series that couple said third word match values to the third level circuit block, each second storage latch series including at least two clocked registers, and
a plurality of third storage latch series that couple said second word match values to the third level circuit block, each third storage latch series including at least one clocked register.

6. A content addressable memory (CAM) device, comprising:
a comparand input that can receive comparand values;
plurality of word registers, each word register storing a data word and comparing the data word to a comparand value at the comparand input and generating a match value reflecting the result of the comparison; and
a multiple match circuit that receives the match values and provides encoding values, the multiple match circuit being configurable between a single match mode in response to a single match mode indication and a multiple match mode in response to a multiple match mode indication, the encoding values representing single match values in the signal match mode, the encoding values representing logical combinations of multiple match values in the multiple match mode.

7. The CAM device of claim 6, wherein:
the multiple match circuit includes a two word multiple match mode and the encoding values represent logical combinations of two match values in the two word multiple match mode.

8. The CAM device of claim 7, wherein:
the multiple match circuit further includes
first level circuits that receive the match values and are enabled by said single mode match indication, and
second level circuits that receive two match values and are enabled by a two word mode match indication.

9. The CAM device of claim 6, wherein:
the multiple match circuit includes a four word multiple match mode and the encoding values represent logical combinations of four word match values in the four word multiple match mode.

10. The CAM device of claim 9, wherein:
the multiple match circuit is configured to the single match mode by the single match mode indication and to the four word multiple match mode by a four word match mode indication, the multiple match circuit further including
first level circuits that receive the match values and are enabled by the single match mode indication, and
third level circuits that receive said four word match values and are enabled by the four word said match mode indication.

11. The CAM device of claim 10, wherein:
the multiple match circuit is further configured to a two word multiple match mode by a two word match mode indication, the multiple match circuit further including
the first level circuits providing single word match values,
second level circuits that receive two word match values and are enabled by said two word mode match indication, the second level circuits providing said two word match values,
the third level circuits providing four word match values, and
select circuits that receive said single word match values, said two word match values, and said four word match values, the select circuits providing said single word match values as outputs in response to the single word match mode indication, the select circuits providing two match values as outputs in response to the said two word match mode indication, and the select circuits providing said four word match values as outputs in response to the four word match mode indication.

12. A content addressable memory (CAM), comprising:

a plurality of CAM cells arranged into a number of word registers, each word register being coupled to a comparand input and providing a word match value when an applied comparand value is compared to a data word value stored within the word register; and a match detect circuit that receives word match values and provides encoding values, the encoding values corresponding to the values of single word match indications in response to a single word match signal, and the encoding values corresponding to a logical combination of multiple word match indications in response to at least a first multiple word match signal.

13. The CAM of claim 12, wherein:

the match detect circuit includes a number of multiple match circuits, each multiple match circuit receiving a first number of word match values and providing a like number of the encoding values, each multiple match circuit providing at least one encoding value that corresponds to the logical combination of the first number of word match values in a first word match mode.

14. The CAM of claim 13, wherein:

each multiple match circuit further provides the encoding values corresponding to the logical combination of a second number of word match values in a second word match mode, the second number being less than the first number.

15. The CAM of claim 14, wherein:

the match detect circuit includes a plurality of input registers that provide word match values to the multiple match circuits.

16. The CAM of claim 15, wherein:

the multiple match circuits include first level circuits that receive single word match values and provide single word match indications, and second level circuits that receive said single word match values and provide said encoding values corresponding to the logical combination of the first number of word match values; and the input registers include first input registers and second input registers, wherein in the first word match mode, the first and second input registers provide word match values in synchronism, and in the second word match mode, the first input registers provide word match values according to a first clock, the second input registers provide word match values according to a second clock that is out of phase with the first clock.

17. The CAM of claim 16, wherein:

the multiple match circuits include third level circuits that receive single word match values and provide encoding values that correspond to the logical combination of the second number of word match values, the second number of word match values being greater than the first number of word match values; and the input registers further include third input registers and fourth input registers, wherein in the first word match mode, the first, second, third and fourth input registers provide word match values in synchronism, in the second word match mode, the first and third input registers provide word match values according to a first clock, the second and fourth input registers provide word match values according to a second clock that is out of phase with the first clock, and in a third word match mode, the first input registers provide word match values according to a first clock, the second input registers provide word match values according to a second clock, the third input registers provide word match values according to a third clock, and the fourth input registers provide word match values according to a fourth clock, the first, second, third, and fourth clocks being out of phase with one another.

18. The CAM of claim 15, wherein:

the multiple match circuits include first level circuits that receive single word match values and provide said single word match indications, and second level circuits that receive single the word match values and provide the encoding values corresponding to the logical combination of the first number of word match values; and the input registers include a first series of registers that couple word match values to the second level circuits.

* * * * *

UNITED STATES PATENT AND TRADEMARK OFFICE
CERTIFICATE OF CORRECTION

PATENT NO.      : 6,253,280 B1
APPLICATION NO. : 09/273422
DATED           : June 26, 2001
INVENTOR(S)     : Eric H. Voelkel It is certified that error appears in the above-identified patent and that said Letters Patent is hereby corrected as shown below:

IN THE SPECIFICATION

At column 5, line 45, please replace "ENCO" with -- ENC0 -- so that the corresponding phrase reads -- active ENC0 signal --.

At column 6, line 15, please replace "1400" with -- I400 -- so that the corresponding phrase reads -- inverter I400 --.

At column 6, line 22, please replace "0404" with -- G404 -- so that the corresponding phrase reads -- gate G404 --.

At column 6, line 25, please replace "1400" with -- I400 -- so that the corresponding phrase reads -- inverter I400 --.

Starting at column 7, line 40 and ending at column 7, line 41 please replace COMPARE1 COMPARE2" with -- COMPARE1, COMPARE2 -- so that the corresponding phrase reads -- shown as COMPARE1, COMPARE2 --.

Starting at column 7, line 41 and ending at column 7, line 42 please replace "COMPARE1 COMPARE2" with -- COMPARE1, COMPARE2 -- so that the corresponding phrase reads -- (COMPARE1, COMPARE2, COMPARE4) --.

UNITED STATES PATENT AND TRADEMARK OFFICE
CERTIFICATE OF CORRECTION

PATENT NO. : 6,253,280 B1
APPLICATION NO. : 09/273422
DATED : June 26, 2001
INVENTOR(S) : Eric H. Voelkel It is certified that error appears in the above-identified patent and that said Letters Patent is hereby corrected as shown below:

IN THE SPECIFICATION

At column 13, line 54, please replace "COMPARE1)" with -- COMPARE1, -- so that the corresponding phrase reads -- COMPARE1, COMPARE2 --.

At column 15, line 17, please replace "COMPARE1)" with -- COMPARE1, -- so that the corresponding phrase reads -- COMPARE1, COMPARE2 --.

Signed and Sealed this

Twenty-seventh Day of May, 2008

JON W. DUDAS
*Director of the United States Patent and Trademark Office*